(12) United States Patent
Manepalli et al.

(10) Patent No.: US 6,794,225 B2
(45) Date of Patent: Sep. 21, 2004

(54) SURFACE TREATMENT FOR MICROELECTRONIC DEVICE SUBSTRATE

(75) Inventors: Rahul Manepalli, Phoenix, AZ (US); Terry Sterrett, Cave Creek, AZ (US); Tian-an Chen, Phoenix, AZ (US); Vassoudevane Lebonheur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/327,645

(22) Filed: Dec. 20, 2002

(65) Prior Publication Data

US 2004/0121512 A1 Jun. 24, 2004

(51) Int. Cl.$^7$ .............................................. H01L 21/48
(52) U.S. Cl. ..................................................... 438/127
(58) Field of Search ............................... 438/106, 110, 438/118, 124, 126, 127, 795, 798

(56) References Cited

U.S. PATENT DOCUMENTS 6,306,683 B1 * 10/2001 Dery et al. ................. 438/108
6,338,985 B1 * 1/2002 Greenwood ................. 438/126
6,429,530 B1 * 8/2002 Chen .......................... 257/778
6,468,833 B2 * 10/2002 Uner et al. .................. 438/115

OTHER PUBLICATIONS

Hagen et al., "Reliable BGA Assembly Using Plasma Chemical Cleaning", 1997, Proceedings of the 1997 1st Electronic Packaging Technology Conference, pp. 41–45.*

* cited by examiner

Primary Examiner—Evan Pert
(74) Attorney, Agent, or Firm—Schwabe, Williamson & Wyatt, P.C.

(57) ABSTRACT

Embodiments of the methods of the present invention provide a Molded Matrix Array Package (MMAP) carrier substrate panel that prevents underfill wetting in the inter-die areas. Surface treatments are provided via plasmas and/or patterned chemical depositions that reduce the surface free energy of the inter-die area to below the surface free energy of the underfill material. The surface treatments prevent the underfill material from wetting the carrier substrate panel and therefore encroachment upon the inter-die area. This provides a underfill material-free inter-die area allowing adhesion between the mold compound and carrier substrate.

24 Claims, 5 Drawing Sheets providing an array of spaced-apart microelectronic dice interconnected with a carrier substrate panel, the array patterned to define an inter-die surface of the carrier substrate panel not covered by a microelectronic die

110 exposing the inter-die surface to a treatment suitable to increase the surface free energy of the inter-die surface to above that of a mold compound

112 applying a layer of mold compound having a surface free energy below that of the carrier substrate surface to cover, underfill, and encapsulate the array of spaced-apart microelectronic dice, adhering to the inter-die surface and filling the space between the microelectronic die and carrier substrate panel

SURFACE TREATMENT FOR MICROELECTRONIC DEVICE SUBSTRATE

FIELD OF THE INVENTION

The present invention relates to microelectronic assemblies and, more particularly, to surface treatment of microelectronic device substrate for underfill and mold compound adhesion.

BACKGROUND OF INVENTION

In the following description, reference is made to microelectronic die, carrier substrate, microelectronic device, and microelectronic package. A microelectronic die comprises a die substrate upon which microcircuits are formed. A microelectronic device is defined as a microelectronic die electrically interconnected with a carrier substrate. A carrier substrate is a structure comprising conductive pathways through which microcircuits of the microelectronic die communicate with external components. A microelectronic package is defined as a microelectronic device that is assembled into a finished package with additional components, such as electrical interconnects, die underfill, a die lid, and a heat dissipation device, among others. An example of a microelectronic package includes, but is not limited to, a flip-chip ball grid array (FC-BGA) microprocessor package.

During the packaging of the microelectronic device into a microelectronic package, underfill material is provided and cured within the space between the microelectronic die and the carrier substrate and surrounding the interconnects. The process of applying underfill to the space between the components is well known. Commonly the underfill material is drawn into the space between the components by capillary action filling the space and surrounding the interconnects with no voids and forming a fillet around the perimeter of the microelectronic die. The underfill material helps to prevent loading on the interconnects during thermal cycling by supporting the components.

In an effort to increase the efficiency of the production of microelectronic devices, efforts have been made to produce many devices simultaneously rather than one at a time. The process is known as Molded Matrix Array Packaging (MMAP). MMAP technology provides a low cost method of simultaneously packaging a plurality of microelectronic dice in a minimal number of process steps.

Using chip-scale flip-chip package technology as an example, MMAP allows multiple dice of the same configuration to be interconnected onto a single carrier substrate panel in an ordered array, underfilled, encapsulated with mold compound, and singulated into individual microelectronic devices by cutting the carrier substrate panel in the area between each microelectronic die, known as the inter-die region. The MMAP process significantly reduces handling as the process steps are performed simultaneously on every microelectronic die.

A critical step in MMAP technology is the adhesion of mold compound to the substrate in the inter-die areas. This is because the final microelectronic device dimension is very close to that possessed by the microelectronic die. Consequently, the bonding area of the mold compound to carrier substrate panel is very small and could possibly compromise package integrity if this bond joint does not possess sufficient bond strength. It has been well established in MMAP molding that the inter-die area must be free of underfill material in order to achieve optimal mold compound to carrier substrate panel adhesion. This is critical because low adhesion will cause delamination at the mold compound/underfill interface upon singulation.

Methods have been attempted to address the issue of maintaining the inter-die areas free of underfill material for MMAP substrates that are underfilled with capillary or no-flow underfill material. Some of those methods include: decreasing carrier substrate panel die density, thus increasing inter-die distance; using substrate dams; closely controlling dispensing volume; and employing complicated and slow dispensing programs. Generally, such methods have been found to be undesirable due to cost, low through-put, and undesirable substrate matrix die densities.

For the reasons stated above, and for other reasons stated below which will become apparent to those skilled in the art upon reading and understanding the present specification, there is a significant need in the art for methods that address the problem of maintaining the inter-die areas free of underfill material for MMAP.

DESCRIPTION

In the following detailed description, reference is made to the accompanying drawings which form a part hereof wherein like numerals designate like parts throughout, and in which is shown by way of illustration specific embodiments in which the invention may be practiced. Embodiments involving the surface treatment of MMAP carrier substrate panels are set forth in order to provide a thorough understanding of the present invention. It is to be understood that other embodiments with other microelectronic die packaging technology and substrates may be utilized and structural or logical changes may be made without departing from the scope of the present invention. Examples of other microelectronic die packaging technology and include, but are not limited to, thermoelectric packaging, system substrates, and motherboards.

Embodiments of the methods of the present invention provide a Molded Matrix Array Package (MMAP) carrier substrate panel that prevents underfill adhesion in the inter-die areas. Surface treatments are provided via plasmas and/or patterned chemical depositions that reduce the surface free energy of the inter-die area to below the surface free energy of the underfill material. The surface treatments prevent the underfill material from wetting the carrier substrate panel and therefore encroachment upon the inter-die area. This provides a underfill material-free inter-die area allowing adhesion between the mold compound and carrier substrate. Other embodiments in accordance with the present invention provide a surface treatment to selectively prevent adhesion of coatings onto the carrier substrate panel.

Figure 1:
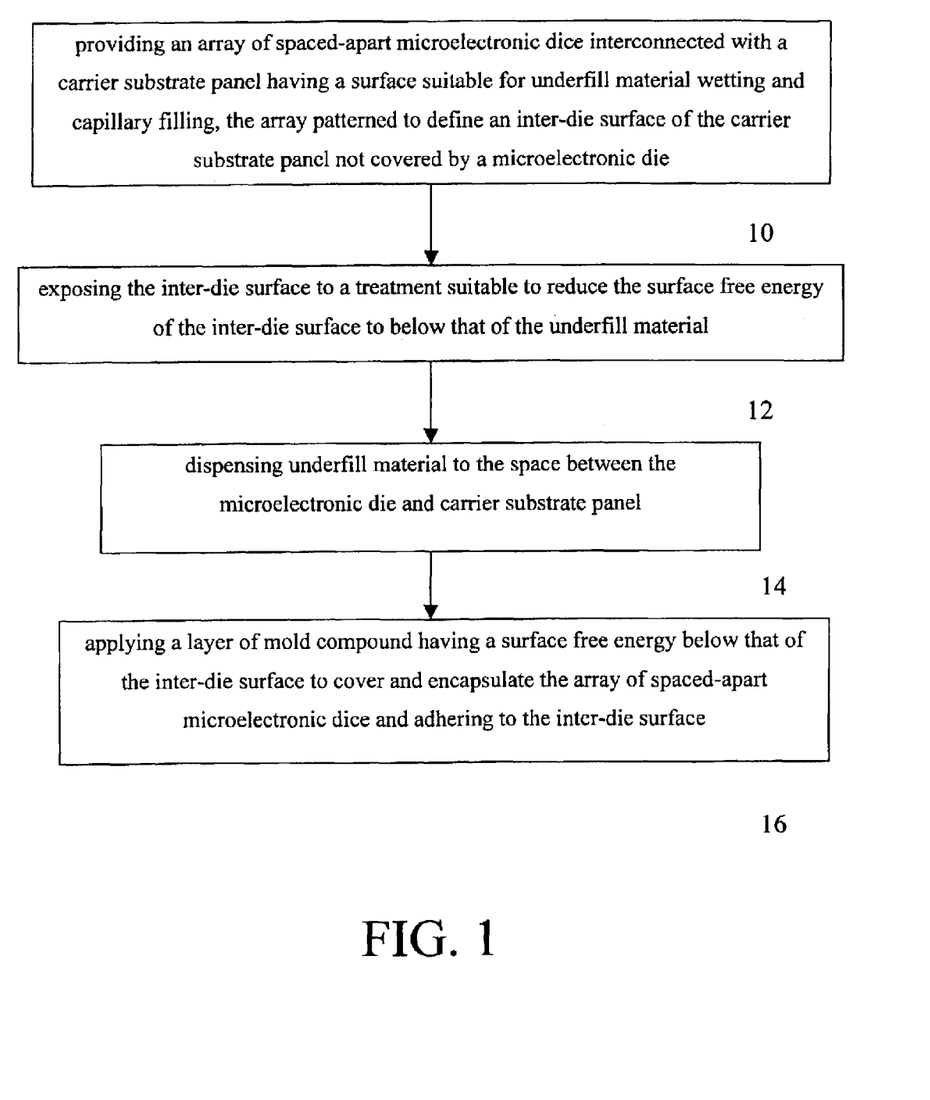
FIG. 1 is a flow diagram of an embodiment of producing a MMAP in accordance with a method of the present invention.

FIG. 1 is a flow diagram of an embodiment of producing a MMAP in accordance with the present invention. The method comprises: providing an array of spaced-apart microelectronic dice interconnected with a carrier substrate panel having a surface suitable for underfill material wetting and capillary filling, the array patterned to define an inter-die surface of the carrier substrate panel 10; exposing the inter-die surface to a treatment suitable to reduce the surface free energy of the inter-die surface to below that of the underfill material 12; dispensing underfill material to the space between the microelectronic die and carrier substrate panel 14; and applying a layer of mold compound to cover and encapsulate the array of spaced-apart microelectronic dice and adhering to the inter-die surface 16.

Figure 2:
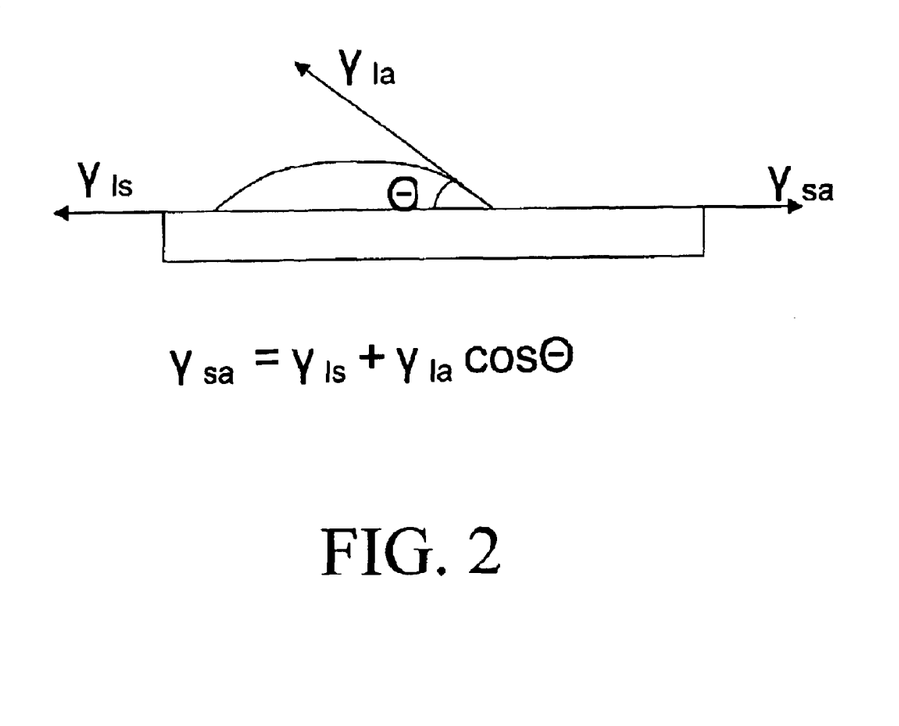
FIG. 2 is a schematic showing the wetting angle of a liquid material upon a surface.

FIG. 2 is a schematic showing the wetting angle of a liquid material upon a surface. The wetting phenomena is controlled by surface thermodynamics of the over all system:

$$Y_{sa} = Y_{ls} + Y_{ls} \cos\theta \cos\theta = (Y_{sa} - Y_{sl})/Y_{la}$$

Where
$Y_{sa}$=interfacial surface tension between substrate and air
$Y_{ls}$=interfacial surface tension between liquid UF material and substrate
$Y_{la}$=interfacial surface tension between liquid UF material and air
$\theta$=wetting angle of fluid In order to maximize the non-wetting characteristic of the inter-die surfaces, the pre-underfill dispense surface treatment must maximize the wetting angle $\theta$, e.g. $\theta$=90. It then follows that for $\theta$=90, cos $\theta$=0, thus $(Y_{sa}-Y_{sl})/Y_{la}$ must approach 0. Consequently, because $Y_{ls}+Y_{la}$ is approximately constant, the ratio $Y_{sa}-Y_{sl}$ must become very small resulting in the surface having a reduced surface tension.

The embodiments of the methods in accordance with the present invention treats the inter-die surface area of the MMAP carrier substrate panel so as to provide the inter-die surface with a surface free energy (Gf) less than that possessed by the underfill material. The underfill material is then prevented from wetting the inter-die surface causing the underfill material to bead-up or be attracted to an adjacent microelectronic die.

Suitable surface treatments include, but are not limited to, plasma surface treatments and patterned low surface free energy chemical treatments. Plasma treatments suitable to causing surface cross-linking, for example, but not limited to CH4 methane plasmas, or incorporation of low Gf species, for example, but not limited to CF4 tetrafluoromethane or C2F6 hexafluoromethane plasmas, yield inter-die surfaces having a lower surface free energy than commonly used underfill material.

Substrate surfaces are designed and coated with solder mask materials providing optimal underfill wetting and adhesion. This is desirable for under die surfaces. However, such characteristics are highly undesirable for inter-die area due to the aforementioned mold compound/underfill adhesion problems.

Figure 3:
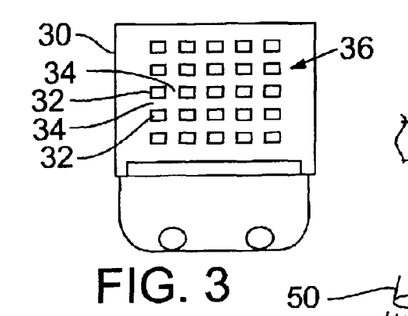
FIGS. 3 and 4 are top and side views of a carrier substrate panel provided with an array of microelectronic dice.
Figure 4:
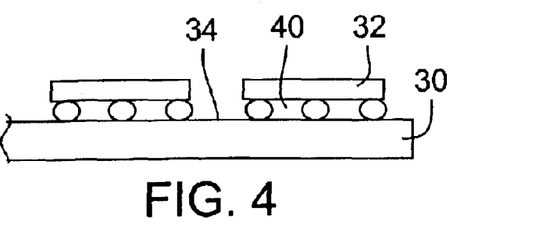

FIGS. 3 and 4 are top and side views of a carrier substrate panel 30 provided with an array 36 of microelectronic dice 32. The array 36 is ordered to define the inter-die surface 34 between the microelectronic dice 32. The spacing between each microelectronic die 32 is predetermined based in-part on the method used to singulate, or cut apart, each microelectronic die 32 with corresponding portion of the carrier substrate panel 30 interconnected with the microelectronic die 32.

Figure 5:
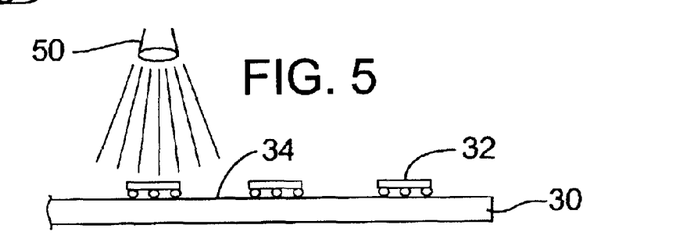
FIG. 5 is a side view of the carrier substrate panel of FIG. 3 undergoing a surface treatment, in accordance with an embodiment of a method of the present invention.

FIG. 5 is a side view of the carrier substrate panel 30 of FIG. 3 undergoing a surface treatment provided by treatment equipment 50, in accordance with an embodiment of a method of the present invention. In an embodiment wherein the surface treatment is by use of a plasma, the microelectronic dice 32 will shadow and protect from treatment, the surface of the carrier substrate panel beneath the microelectronic dice 32. Therefore, substantially only the inter-die surface 34 will be exposed to the plasma and be treated to resist wetting by an underfill material.

Figure 6:
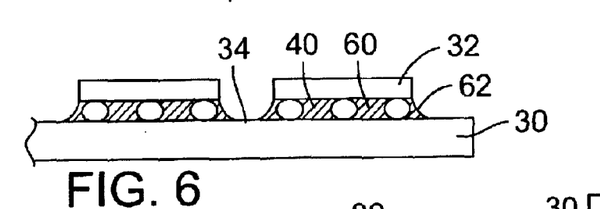
FIGS. 6 and 7 are side and top views of the carrier substrate panel of FIG. 5 after having an underfill material provided in the gap between the microelectronic dice and the carrier substrate panel, in accordance with an embodiment of a method of the present invention.
Figure 7:
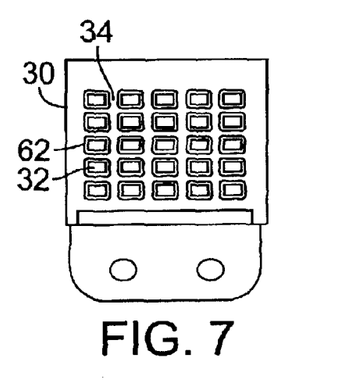

FIGS. 6 and 7 are side and top views of the carrier substrate panel 30 of FIG. 5 after having an underfill material 60 provided in the gap 40 between the microelectronic dice 32 and the carrier substrate panel 30. The underfill material 60 forms a filet 62 of underfill material 60 around the perimeter of each microelectronic die 32. The low surface free energy of the inter-die surface 34 prevents underfill material 60 from wetting and adhering to the inter-die surface 34.

Figure 8:
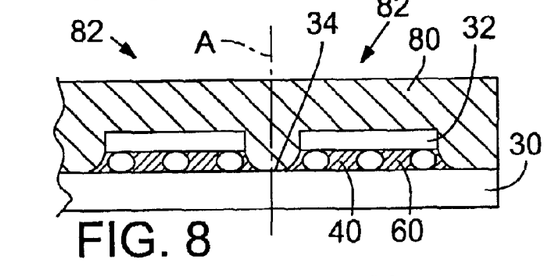
FIG. 8 is a side view of the carrier substrate panel of FIG. 6 after having mold compound applied to the microelectronic dice and the inter-die surface, in accordance with an embodiment of a method of the present invention.

FIG. 8 is a side view of the carrier substrate panel 30 of FIG. 6 after having mold compound 80 applied to the microelectronic dice 32 and the inter-die surface 34. As there is no underfill material 60 on the inter-die surface 34, a suitable adhesive bond is achieved that resists delamination when the microelectronic device 82 is singulated by cutting along line A.

Figure 9:
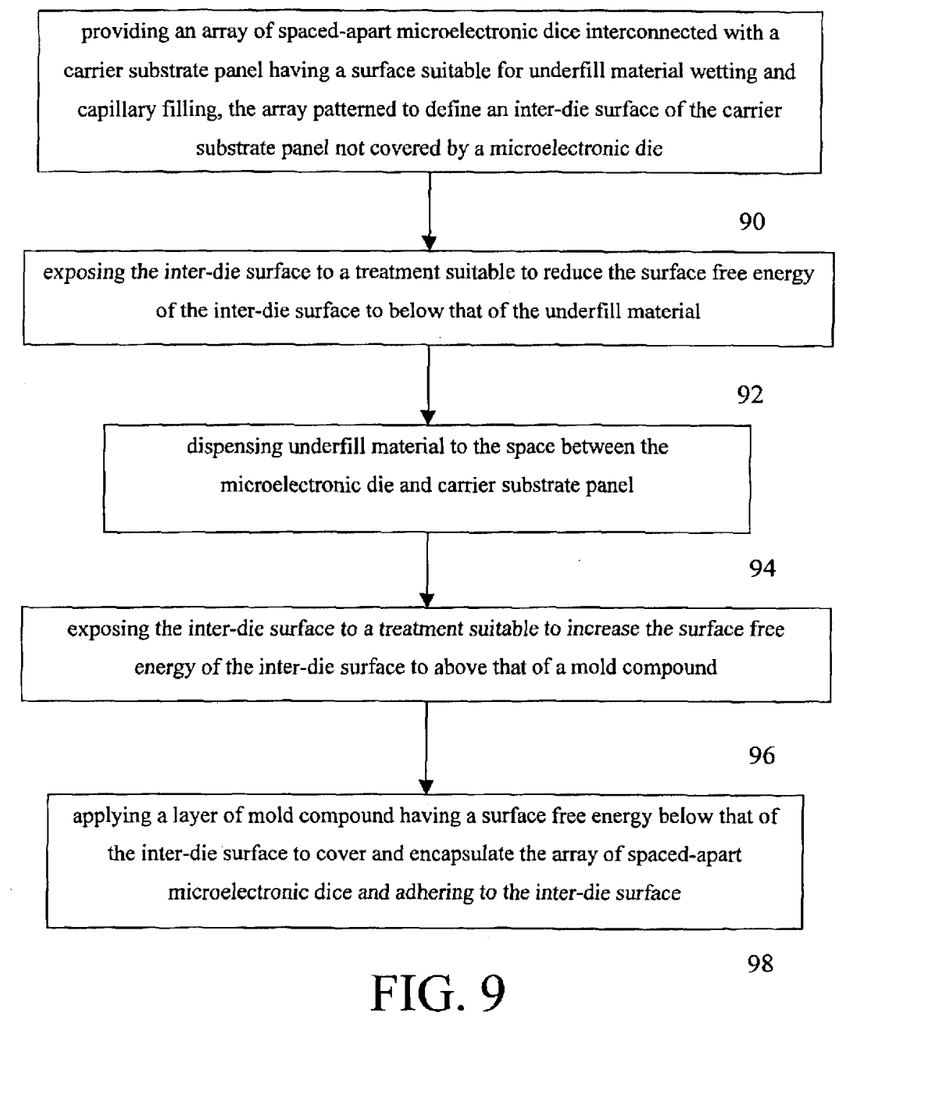
FIG. 9 is a flow diagram of an embodiment of producing a MMAP in accordance with another method of the present invention.

The low surface free energy treatment can be reversed post-underfill dispense and cure, and prior to the mold process. FIG. 9 is a flow diagram of an embodiment of producing a MMAP in accordance with the present invention. The method comprises: providing an array of spaced-apart microelectronic dice interconnected with a carrier substrate panel having a surface suitable for underfill material wetting and capillary filling, the array patterned to define an inter-die surface of the carrier substrate panel 90; exposing the inter-die surface to a treatment suitable to reduce the surface free energy of the inter-die surface below that of the underfill material 92; dispensing underfill material to the space between the microelectronic die and carrier substrate panel 94; exposing the inter-die surfaces to a treatment suitable to increase the surface free energy of the inter-die surface above that of the mold material 96; and applying a layer of mold compound to cover and encapsulate the array of spaced-apart microelectronic dice and adhering to the inter-die surface 98.

After dispensing and before molding, the surface treatment of the inter-die surface can be removed via another treatment step. In one embodiment of the method for removing the surface treatment, a plasma treatment using, but not limited to, an ozone, oxygen or argon based plasma, is suitable to remove the inter-die surface cross-linking. This inter-die surface treatment increases the free energy of the inter-die surface to its original levels, thereby enabling uniform flow and good adhesion of the mold compound.

Figure 10:
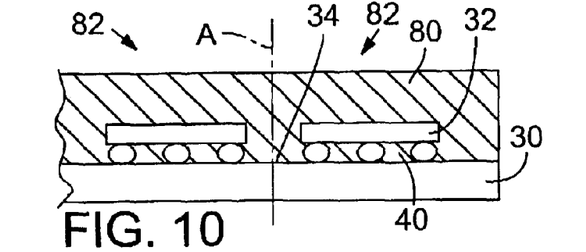
FIG. 10 is a side view of the carrier substrate panel of FIG. 4 after having mold compound applied to the microelectronic dice, the inter-dies surface and provided in the gap between the microelectronic dice and the carrier substrate panel, in accordance with an embodiment of a method of the present invention.

In another embodiment in accordance with the present invention, an underfill material is not used and the mold compound is used for both the underfill and the mold compound. FIG. 10 is a side view of the carrier substrate panel 30 of FIG. 4 after mold compound 80 is applied to the microelectronic dice 32, gap 40 and the inter-die surface 34.

Figure 11:
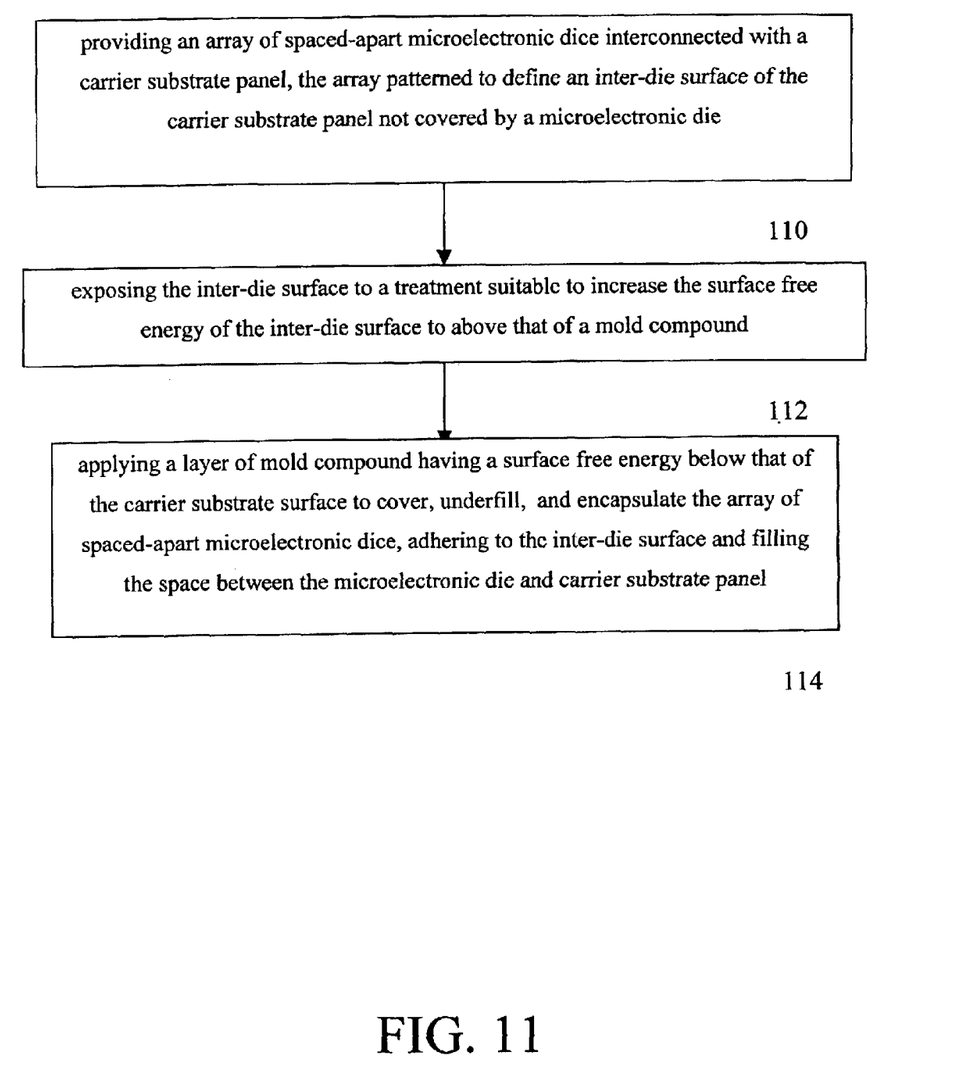
FIG. 11 is a flow diagram of an embodiment of producing a MMAP in accordance with another method of the present invention.

FIG. 11 is a flow diagram of an embodiment of producing a MMAP in accordance with the present invention. The method comprises: providing an array of spaced-apart microelectronic dice interconnected with a carrier substrate panel, the array patterned to define an inter-die surface of the carrier substrate panel 110; exposing the inter-die surfaces to a treatment suitable to increase the surface free energy of the inter-die surface above that of the mold compound 112; and applying a layer of mold compound to cover, underfill, and encapsulate the array of spaced-apart microelectronic dice, adhering to the inter-die surface and filling the space between the microelectronic die and carrier substrate panel 114.

The carrier substrate 30 surface energy may be too low for proper dispense and fill of the mold compound 80. Before the mold process, the surface free energy of the surface can be raised using a plasma treatment, including, but not limited to, ozone, oxygen or argon based plasma This surface treatment increases the free energy of the carrier substrate surface providing uniform flow and good adhesion of the mold compound.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for interconnecting electronic components, comprising:

providing an array of spaced-apart microelectronic dice interconnected with a carrier substrate panel having a surface suitable for underfill material wetting and capillary filling, the array patterned to define an inter-die surface of the carrier substrate panel not covered by a microelectronic die;

exposing the inter-die surface to a treatment suitable to reduce surface free energy of the inter-die surface to below that of an underfill material;

dispensing the underfill material to the space between the microelectronic die and carrier substrate panel; and applying a layer of mold compound having a surface free energy below that of the inter-die surface to cover and encapsulate the array of spaced-apart microelectronic dice and adhering the mold compound to the inter-die surface.

2. The method of claim 1, wherein the exposing of the inter-die surface to a treatment suitable to reduce the surface free energy of the inter-die surface to below that of an underfill material comprises exposing the inter-die surface to a plasma treatment suitable to reduce the surface free energy of the inter-die surface to below that of the underfill material.

3. The method of claim 2, wherein the exposing of the inter-die surface to a treatment suitable to reduce the surface free energy of the inter-die surface to below that of the underfill material comprises exposing the inter-die surface to a plasma treatment selected from the group consisting of CH4, CF4, and C2F6.

4. The method of claim 2, wherein the exposing of the inter-die surface to a treatment suitable to reduce the surface free energy of the inter-die surface to below that of an underfill material comprises exposing the inter-die surface to low surface free energy chemical treatments.

5. The method of claim 2, further comprising: exposing the inter-die surface to a treatment suitable to increase the surface free energy of the inter-die surface to above that of a mold compound prior to applying the layer of mold compound.

6. The method of claim 5, wherein the exposing of the inter-die surface to a treatment suitable to increase the surface free energy of the inter-die surface to above that of a mold compound comprises exposing the inter-die surface to a plasma treatment suitable to increase the surface free energy of the inter-die surface to above that of a mold compound.

7. The method of claim 6, wherein the exposing of the inter-die surface to a plasma treatment comprises exposing the inter-die surface to a plasma treatment selected from the group consisting of ozone, oxygen and argon.

8. A method for preventing underfill material adhesion to the inter-die surface of a molded matrix array package carrier substrate panel, comprising:

exposing the inter-die surface to a treatment suitable to reduce surface free energy of the inter-die surface to below that of an underfill material; and dispensing the underfill material to the space between the microelectronic die and carrier substrate panel.

9. The method of claim 8, wherein the exposing of the inter-die surface to a treatment suitable to reduce surface free energy of the inter-die surface to below that of an underfill material comprises exposing the inter-die surface to a plasma treatment suitable to reduce the surface free energy of the inter-die surface to below that of the underfill material.

10. The method of claim 8, wherein the exposing of the inter-die surface to a treatment suitable to reduce surface free energy of the inter-die surface to below that of an underfill material comprises exposing the inter-die surface to low surface free energy chemical treatments.

11. The method of claim 8, further comprising:

applying a layer of mold compound having a surface free energy below that of the inter-die surface to cover and encapsulate the array of spaced-apart microelectronic dice and adhering to the inter-die surface; and exposing the inter-die surface to a treatment suitable to increase the surface free energy of the inter-die surface to above that of the mold compound prior to applying the layer of mold compound.

12. The method of claim 11, wherein the exposing of the inter-die surface to a treatment suitable to increase the surface free energy of the inter-die surface to above that of a mold compound comprises exposing the inter-die surface to a plasma treatment suitable to increase the surface free energy of the inter-die surface to above that of a mold compound.

13. The method of claim 12, wherein the exposing of the inter-die surface to a plasma treatment comprises exposing the inter-die surface to a plasma treatment selected from the group consisting of ozone, oxygen and argon.

14. The method of claim 8, wherein the exposing of the inter-die surface to a treatment suitable to reduce surface free energy of the inter-die surface to below that of an underfill material comprises exposing the inter-die surface to a plasma treatment selected from the group consisting of CH4, CF4, and C2F6.

15. A method for producing microelectronic devices, comprising:
    providing an array of spaced-apart microelectronic dice interconnected with a carrier substrate panel having a surface suitable for underfill material wetting and capillary filling, the array patterned to define an inter-die surface of the carrier substrate panel not covered by a microelectronic die;
    exposing the inter-die surface to a treatment suitable to reduce surface free energy of the inter-die surface to below that of an underfill material;
    dispensing underfill material to the space between the microelectronic die and carrier substrate panel;
    applying a layer of mold compound having a surface free energy below that of the inter-die surface to cover and encapsulate the array of spaced-apart microelectronic dice and adhering the mold compound to the inter-die surface; and
    singulating the microelectronic devices by cutting through the mold compound and carrier substrate panel between the microelectronic dice.

16. The method of claim 15, wherein the exposing of the inter-die surface to a treatment suitable to reduce surface free energy of the inter-die surface to below that of an underfill material comprises exposing the inter-die surface to a plasma treatment suitable to reduce the surface free energy of the inter-die surface to below that of the underfill material.

17. The method of claim 15, wherein the exposing of the inter-die surface to a treatment suitable to reduce surface free energy of the inter-die surface to below that of an underfill material comprises exposing the inter-die surface to a plasma treatment selected from the group consisting of CH4, CF4, and C2F6.

18. The method of claim 15, wherein the exposing of the inter-die surface to a treatment suitable to reduce surface free energy of the inter-die surface to below that of then underfill material comprises exposing the inter-die surface to low surface free energy chemical treatments.

19. The method of claim 15, further comprising:
    exposing the inter-die surface to a treatment suitable to increase the surface free energy of the inter-die surface to above that of a mold compound prior to applying the layer of mold compound.

20. The method of claim 19, wherein the exposing of the inter-die surface to a treatment suitable to increase the surface free energy of the inter-die surface to above that of a mold compound comprises exposing the inter-die surface to a plasma treatment suitable to increase the surface free energy of the inter-die surface to above that of a mold compound.

21. The method of claims 20, wherein the exposing of the inter-die surface to a plasma treatment comprises exposing the inter-die surface to a plasma treatment selected from the group consisting of ozone, oxygen and argon.

22. A method for producing microelectronic devices, comprising:
    providing an array of spaced-apart microelectronic dice interconnected with a carrier substrate panel, the array patterned to define an inter-die surface of the carrier substrate panel;
    exposing the inter-die surface to a treatment suitable to increase surface free energy of the inter-die surface above that of a mold compound;
    applying a layer of the mold compound to cover and encapsulate the array of spaced-apart microelectronic dice, adhering the mold compound to the inter-die surface filling the space between the microelectronic die and carrier substrate panel; and
    singulating the microelectronic devices by cutting through the mold compound and carrier substrate panel between the microelectronic dice.

23. The method of claim 22, wherein: the exposing of the inter-die surface to a treatment suitable to increase surface free energy of the inter-die surface to above that of a mold compound comprises exposes the inter-die surface to a plasma treatment suitable to increase the surface free energy of the inter-die surface to above that of the mold compound.

24. The method of claim 23, wherein the exposing of the inter-die surface to a plasma treatment comprises exposing the inter-die surface to a plasma treatment selected from the group consisting of ozone, oxygen and argon.

* * * * *

UNITED STATES PATENT AND TRADEMARK OFFICE
CERTIFICATE OF CORRECTION

PATENT NO. : 6,794,225 B2
DATED : September 21, 2004
INVENTOR(S) : Manepalli et al.

It is certified that error appears in the above-identified patent and that said Letters Patent is hereby corrected as shown below:

Column 7,
Lines 45-46, "...of then underfill material..." should read -- ...of an underfill material... --.

Column 8,
Lines 30-32, "...inter-die surface filling the space between the microelectronic die and carrier substrate panel; and" should read -- ...inter-die surface; and --.
Line 39, "...comprises exposes the..." should read -- ...comprises exposing the... --.

Signed and Sealed this

Twenty-fourth Day of January, 2006

JON W. DUDAS
*Director of the United States Patent and Trademark Office*